(12) United States Patent
Hersee et al.

(10) Patent No.: US 8,624,968 B1
(45) Date of Patent: Jan. 7, 2014

(54) LENS-LESS DIGITAL MICROSCOPE (75) Inventors: Stephen D. Hersee, Albuquerque, NM (US); Majeed M. Hayat, Albuquerque, NM (US); Pradeep Sen, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 777 days.

(21) Appl. No.: 12/880,923

(22) Filed: Sep. 13, 2010

Related U.S. Application Data (63) Continuation-in-part of application No. 12/103,920, filed on Apr. 16, 2008.

(60) Provisional application No. 60/913,927, filed on Apr. 25, 2007, provisional application No. 60/973,465, filed on Sep. 19, 2007, provisional application No. 61/276,400, filed on Sep. 11, 2009.

(51) Int. Cl.
H04N 9/47 (2006.01)
H04N 5/243 (2006.01)
H04N 7/18 (2006.01)

(52) U.S. Cl.
USPC .............. 348/80; 348/79; 382/128; 382/276

(58) Field of Classification Search
USPC ........ 348/79, 80; 382/128, 276; 359/385–390
See application file for complete search history.

(56) References Cited

U.S. PATENT DOCUMENTS

| | | | |
|---|---|---|---|
| 7,508,505 B2 * | 3/2009 | Lustenberger et al. | 356/317 |
| 2005/0047172 A1 * | 3/2005 | Sander | 362/554 |
| 2005/0271548 A1 | 12/2005 | Yang et al. | |
| 2007/0052660 A1 * | 3/2007 | Montbach et al. | 345/102 |
| 2007/0207061 A1 | 9/2007 | Yang et al. | |
| 2007/0211460 A1 * | 9/2007 | Ravkin | 362/231 |
| 2009/0114900 A1 * | 5/2009 | Udagawa | 257/13 |
| 2009/0309135 A1 * | 12/2009 | Udagawa | 257/201 |
| 2010/0207040 A1 * | 8/2010 | Tanaka et al. | 250/492.2 |

* cited by examiner

Primary Examiner — Haresh N Patel

(74) Attorney, Agent, or Firm — MH2 Technology Law Group, LLP (57) ABSTRACT

Exemplary embodiments provide microscope devices and methods for forming and using the microscope devices. The microscope device can include a light emitter array with each light emitter individually addressable to either emit or detect light signals. Magnified images of a sample object can be generated by a reflection mechanism and/or a transmission mechanism using one or more microscope devices in an imaging system. Real-time computer control of which microscope pixels are viewed can allow the user to digitally replicate the "fovea" function of human vision. Viewing an object from both sides in the double-sided microscope system and from multiple pixel positions can allow the microscope to reconstruct pseudo-3D images of the object.

6 Claims, 10 Drawing Sheets

LENS-LESS DIGITAL MICROSCOPE

RELATED APPLICATIONS

This application is a continuation-in-part of U.S. patent application Ser. No. 12/103,920, now copending, entitled "Solid State Microscope," filed Apr. 16, 2008, which claims priority to U.S. Provisional Patent Applications Set. No. 60/913,927, filed Apr. 25, 2007, and Ser. No. 60/973,465, filed Sep. 19, 2007, all of which are hereby incorporated by reference in their entirety.

This application also claims priority from U.S. Provisional Patent Application Ser. No. 61/276,400 filed Sep. 11, 2009, which is hereby incorporated by reference in its entirety.

GOVERNMENT RIGHTS

This invention was made with government support under Contract No. EEC0812056 awarded by the National Science Foundation (NSF), and under Contract No. HR0011-05-1-0006 awarded by the Defense Advanced Research Projects Agency (DARPA). The Government has certain rights in the invention.

DESCRIPTION OF THE INVENTION

1. Field of the Invention

This invention relates generally to solid-state microscope devices and, more particularly, relates to lens-less semiconductor-based digital microscope devices, systems, and methods for fabricating and using them.

2. Background of the Invention

A conventional optical microscope uses optical lenses to gather light from an illuminated object and provide a magnified image of that object to the viewer. An additional light source, that itself may require conditioning optics, is often used to illuminate the sample for the conventional optical microscopes.

Such conventional optical microscopes, however, may have drawbacks and disadvantages for specific microscopic applications. For example, when conventional optical microscopes are used to observe biological samples, the strong illumination power of the conventional optical microscopes may irreversibly degrade biological samples, e.g., living cells. This is known as photo-toxicity in the prior art. In addition, it is desirable for modern microscopes to be small, light weight, and free of moving parts, which conventional optical microscopes are not.

Thus, there is a need to overcome these and other problems of the prior art and to provide a compact, portable and robust lens-less microscope that has a high image resolution and a controllable illumination power.

SUMMARY OF THE INVENTION

According to various embodiments, the present teachings include a microscope device. The microscope device can include a readout integrated circuit (ROIC); and a light emitting diode (LED) structure disposed on the ROIC. The LED structure can include a plurality of LED core-shell structures with each LED core-shell structure including a layered shell enveloping a nanowire core. The layered shell can include a multi-quantum-well (MQW) active region. A p-side electrode can envelop the layered core-shell structure and can be electrically connected with the ROIC. Each p-side electrode can have an average thickness ranging from about 100 nm to about 500 nm, and can be electrically isolated from adjacent p-side electrodes. A growth mask dielectric can be disposed on the plurality of LED core-shell structures with each nanowire core disposed through the growth mask dielectric to connect to an n-side semiconductor that is situated on the growth mask dielectric.

According to various embodiments, the present teachings also include a method of forming a microscope device. In this method, an LED (light emitting diode) array can be formed to include a plurality of LED core-shell structures. Each LED core-shell structure can include a doped buffer layer disposed on a substrate; a growth mask dielectric disposed on the doped buffer layer; a nanowire core formed on the doped buffer layer through the growth mask dielectric; and a layered shell formed to envelop the nanowire core and to include a multi-quantum-well (MQW) active region. A p-side semiconductor can then be formed to envelop the layered shell of each LED core-shell, followed by forming a p-side electrode having a thickness ranging from about 100 nm to about 500 nm to envelop the p-side semiconductor. Adjacent p-side electrodes can be electrically isolated by a dielectric material, providing a surface including both the p-side electrodes and the dielectric material. The LED array can then be inverted to attach the surface having both the p-side electrodes and the dielectric material to a readout integrated circuit (ROIC). The substrate of the inverted LED array can then be removed to expose the doped buffer layer, which is then patterned to form a plurality of n-side semiconductors on the growth mask dielectric. Each n-side semiconductor can be connected with the nanowire core of a corresponding LED core-shell structure.

According to various embodiments, the present teachings further include a method for producing a magnified image of an object. In this method, a first microscope device having an LED array and a second microscope device having an LED array can be provided and configured to allow simultaneous viewing of an object from both the first and the second microscope devices. When producing a magnified image of the object, a first image pixel can be formed by steps including: switching on a first LED of the LED array of the first microscope device to illuminate a first portion of the object; using a first plurality of LEDs surrounding the first LED of the first microscope device to collect a reflected light from the illuminated first portion of the object; and using a first plurality of corresponding LEDs of the LED array of the second microscope device to collect a transmitted light through the illuminated first portion of the object. A second image pixel can be formed by steps including: switching on a second LED of the LED array of the first microscope device to illuminate a second portion of the object; using a second plurality of LEDs surrounding the second LED of the first microscope device to collect a reflected light from the illuminated second portion of the object; and using a second plurality of corresponding LEDs of the LED array of the second microscope device to collect a transmitted light through the illuminated second portion of the object.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Exemplary embodiments provide solid-state microscope devices and methods for forming and using them. The solid-state microscope devices can include a light emitter array having a plurality of light emitters with each light emitter individually addressable. During operation, each light emitter can be biased in one of three operating states including an emit state, a detect state, and an off state. The light emitter can be an LED (light emitting diode) including, but not limited to, a nanowire-based LED or a planar LED, to provide various desired image resolutions for the microscope devices. In an exemplary embodiment for near-field microscopy, the imaging resolution can be approximately defined by a pitch p, i.e., a center-to-center spacing between adjacent light emitters, of the light emitter array.

In various embodiments, the light emitters, for example, the nanowire-based LED or the planar LED, and/or the microscope devices can be formed using a III-V compound semiconductor materials system, such as, a Group III-N compound materials system including one or more materials of GaN, AlN, InN, InGaN, AlInGaN, AlGaN, InP, GaAs, and a combination thereof.

In an exemplary embodiment, the light emitters can include a layered multi-quantum-well (MQW) structure having a MQW active region disposed between doped barrier layers. The MQW active region can include, for example, Group III-N quantum wells, such as InGaN/GaN quantum wells, AlGaN/GaN quantum wells, or other III-N quantum wells. For example, the MQW active region can include alternating layers of $Al_xGa_{1-x}N$ and GaN, or $In_xGa_{1-x}N$ and GaN, where x can be any number less than or equal to 1.00.

Various dopants can be used for the layered MOW structure or for the light emitters to provide a desired conductivity. The dopant can be, for example, a p-type dopant chosen from Group II of the periodic table (e.g. Mg, Zn, Cd or Hg); a p-type dopant chosen from Group IV of the periodic table, (e.g., C); or an n-type dopant chosen from a group consisting of Si, Ge, Sn, S, Se and Te.

The MQW active region can be disposed between a first doped layer, e.g., n-doped GaN or n-doped $Al_xGa_{1-x}N$, and a second doped layer, e.g., p-doped $Al_xGa_{1-x}N$. A third doped layer can also be formed on the second doped layer and can be formed of, for example, p-doped GaN.

In embodiments, the light emitters can include a substrate formed of a material including, but not limited to, sapphire, silicon carbide (SiC), silicon (Si), silicon-on-insulator (SOI), III-V semiconductor compounds such as GaN or GaAs, metal, ceramic, or glass.

The light emitters and/or the microscope devices can be formed by various crystal growth techniques including, but not limited to, metal-organic chemical vapor deposition (MOCVD) (also known as organometallic vapor phase epitaxy (OMVPE)), pulsed MOCVD, molecular-beam epitaxy (MBE), gas source MBE (GSMBE), metal-organic MBE (MOMBE), atomic layer epitaxy (ALE), and/or hydride vapor phase epitaxy (HVPE).

The dielectric materials can be involved in formation of the disclosed light emitters and/or microscope devices. For example, dielectric materials can be used for electrical isolation between the nanowire core-shell LEDs and/or planar LEDs, and for electrical isolation between the p-side electrodes (or n-side electrodes) of individual LEDs. The dielectric materials can also be used for a selective growth mask when forming nanowire-based structures or devices.

As used herein, the dielectric materials can include, but are not limited to, silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating materials.

In embodiments, conductive materials and structures can be used for forming the exemplary microscope devices. For example, conductive materials and structures can be used as bump bonds, electrodes, and/or electrical contacts. The conductive materials and structures can include metals such as indium (In), titanium (Ti), aluminum (Al), platinum (Pt), nickel (Ni) or gold (Au), for example, in a number of multi-layered combinations such as Al/Ti/Pt/Au, Ni/Au, Ti/Al, Ti/Au, Ti/Al/Ti/Au, and/or Ti/Al/Au using techniques known to one of ordinary skill in the art.

In various embodiments, the disclosed microscope devices can be light weight and small in size. For example, a microscope device can have a weight and size both less than 1/1000 of the weight and size of a conventional optical microscope. In addition, the disclosed microscope devices can be highly portable and robust with desired image resolutions. In embodiments, the lens-less digital microscope devices can be placed in chemical aggressive environments, underwater, or even be configured for in-vivo observation.

In one embodiment, the disclosed microscope devices can include a plurality of nano-photonic light emitting devices, such as nanowire-based LEDs, having an image resolution of about 1 micron or greater, for example, from about 1 micron to about 10 microns. In another embodiment, the disclosed microscope devices can include a planar LED array having an image resolution of about 10 microns to about 50 microns or greater. Note that the above resolution values are "raw" values that do not include improvements gained by subsequent digital processing that is known to one of ordinary skill in the related art. In various embodiments, the subsequent digital processing of the data from these microscope devices can take place in a connected computer control system to further improve the above resolution values. For example, the image resolution, after the digital processing, can range from about 1 μm to about 100 μm, although the image resolution is not limited according to various embodiments of the present teachings.

Figure 1A:
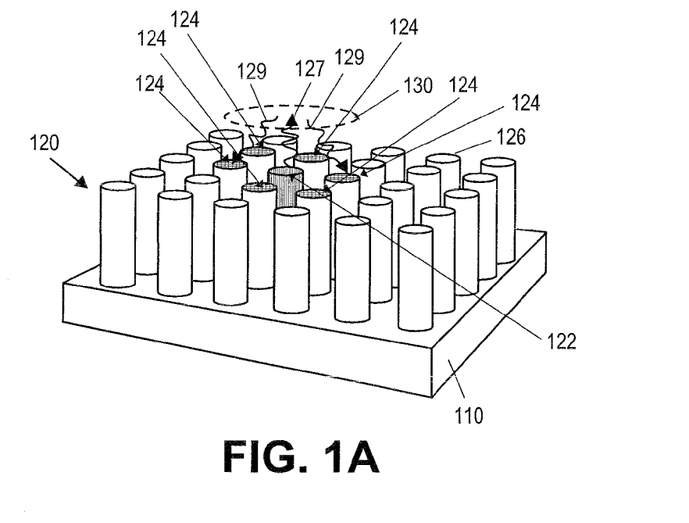
FIG. 1A depicts an exemplary LED (light emitting diode) system having an LED array in accordance with various embodiments of the present teachings.

FIG. 1A is a schematic of an exemplary light emitter system 100A in accordance with various embodiments of the present teachings. It should be readily apparent to one of ordinary skill in the art that the system 100A depicted in FIG. 1A represents a generalized schematic illustration and that other layers/light emitters can be added or existing layers/light emitters can be removed or modified.

As shown, the exemplary light emitter system 100A can include a plurality of light emitters 122, 124, or 126, which can be configured as a light emitter array 120 over a substrate 110. Sample object 130 placed over the light emitter array 120 can thus be viewed and/or examined as a magnified image.

The substrate 110 can be, e.g., any substrate on which Group III-N materials or other light-emitting semiconductors can be grown. The substrate 110 can include, but is not limited to, Si, SiC, Sapphire, GaN and/or GaAs.

The light emitters 122, 124, or 126 can include, for example, a nanowire-based LED, a planar LED, or any other suitable light emitters depending on the microscopic applications. In various embodiments, each light emitter can be biased in one of three operating states including an emit state, a detect state, and an off state, in order to operate the system 100A. For example, as shown in FIG. 1A, the plurality of light emitters can include sets of light emitters including a first set of the light emitters 122 surrounded by a second set of light emitters 124, and a third set of light emitters 126. In various embodiments, each set of light emitters can include one or more light emitters.

The light emitter system 100A can build a digital image using a reflection mechanism and/or a transmission mechanism. In embodiments for reflection based operations, the first set of light emitters 122 can be "on" emitters that can illuminate a small area of the sample object 130. For example, the small area can have an area on an order of $\mu m^2$. The emitted light 127 from the "on" light emitters 122 can then be reflected, scattered, and/or diffracted from the sample object 130 and the returned light, e.g., the reflected light 129, can then be collected immediately by the surrounding set of light emitters 124, which are electrically reverse-biased to function as photo-detectors. The first set of emitters 122 can be forward biased so that they emit light. The third set of light emitters 126, i.e., the remaining light emitters of the light emitter array 120 can be unbiased, e.g., switched off during this step.

The image resolution of the light emitter system 100A can correspond to the size of the illuminated light spot on the sample object 130. The size of the illuminated spot (not illustrated) can correspond approximately to the pitch p of the light emitter array 120 and also depend on how much diffraction, reflection, and/or absorption occur in the sample object 130. As shown, the plurality of light emitters 122, 124, 126 can possess a controllable pitch p and thus to control the resulting image resolution. In some embodiments, the light emitter array 120 can be in a high density having a pitch p, e.g., of about 1 micron to 10 microns for an image resolution of about 10 microns or less. In other embodiments, the pitch p can be, for example, in a range of about 10 microns to about 50 microns, or greater, according to an image resolution requirement.

In an exemplary embodiment for the reflection type mechanism, several "rings" of light emitters 124 can surround one light emitter 122 and can be biased as detectors to detect the reflected light 129 from the illuminated spot on the sample object 130, wherein the sample object is illuminated by the light emitter 122.

In another exemplary embodiment for operations that involve transmission mechanism, a conventional photodetector (not shown in FIG. 1A) can be placed above the sample object 130. Such photodetector can have large area for detecting the transmitted light through an optically clear sample object 130. For example, one light emitter 122 can be biased as an "on" emitter that can illuminate a small area of the sample object 130. The emitted light 127 from the "on" light emitter 122 can be transmitted through the sample object 130 and the transmitted light (not illustrated in FIG. 1A) can then be collected immediately by the photodetector placed thereabove.

Figure 8A:
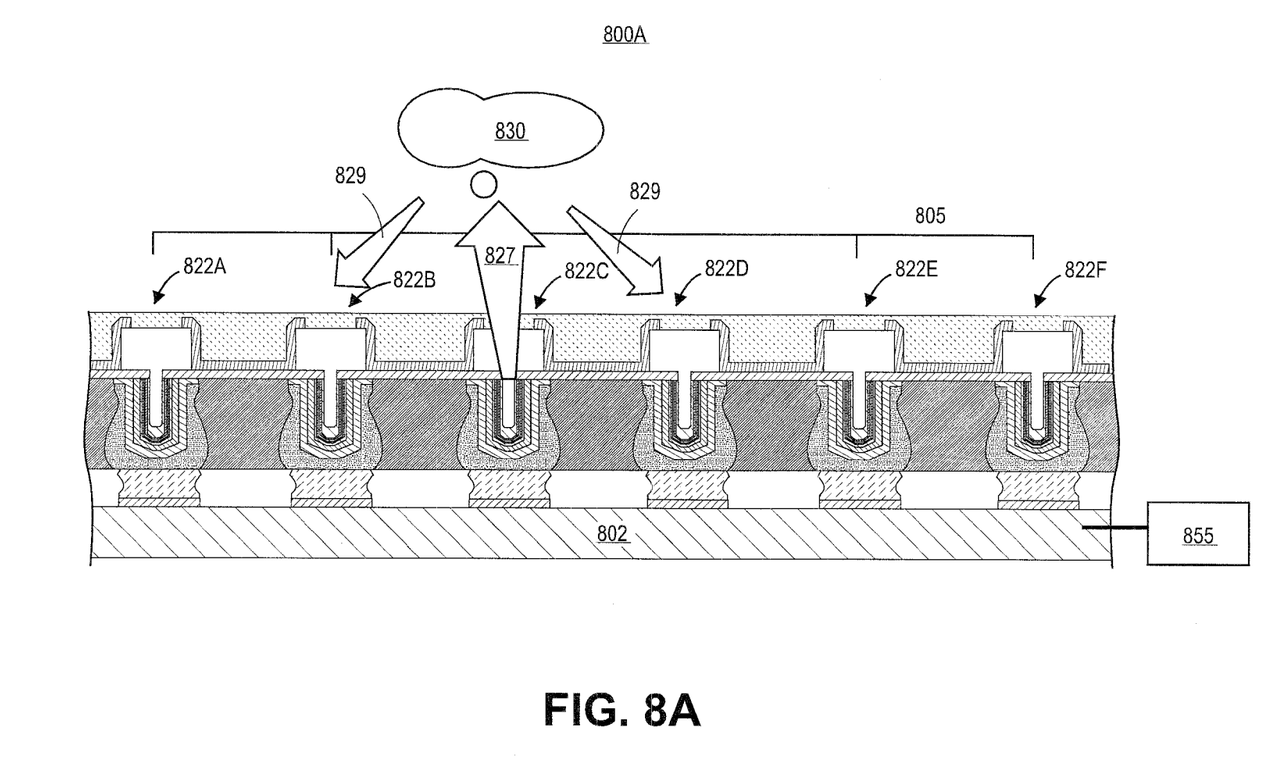
FIGS. 8A-8B depict exemplary microscope imaging systems in accordance with various embodiments of the present teachings.
Figure 8B:
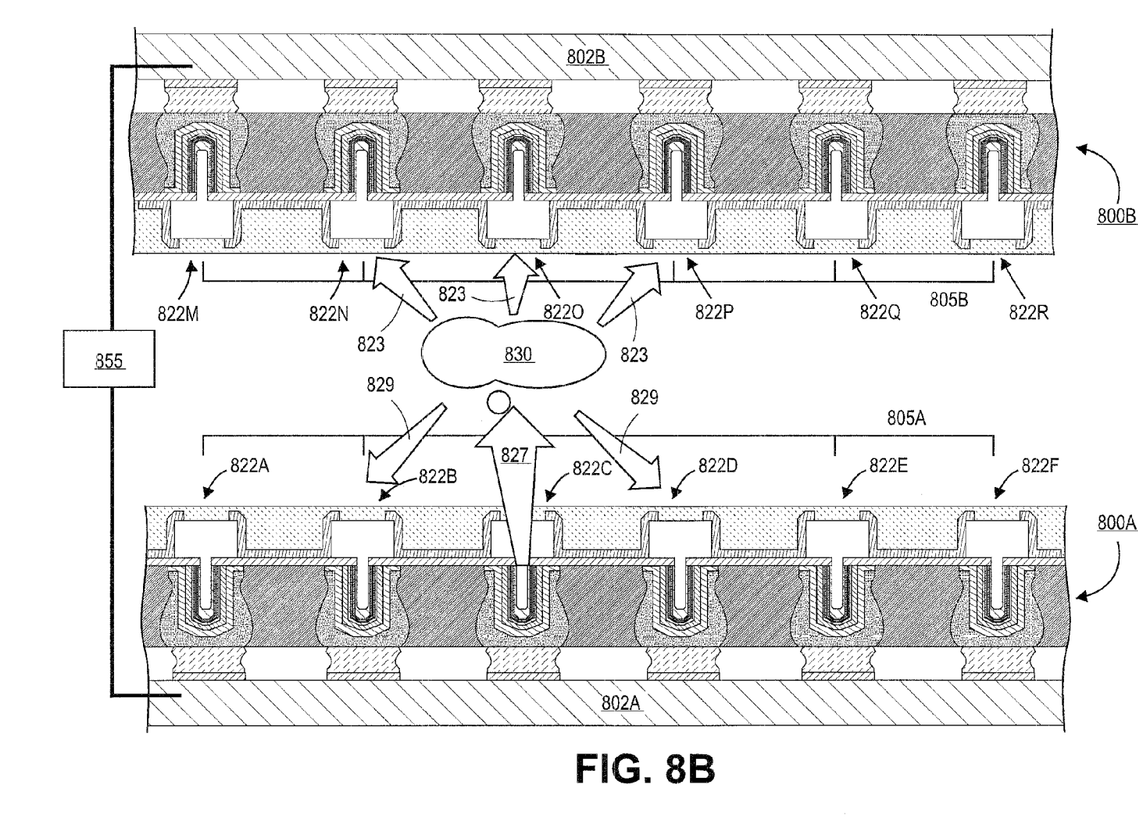

In a third exemplary embodiment, a detector array having a detector pitch that is identical to the pitch p of the LED emitter array, can be placed above the emitter array (see FIG. 8B). The spacing between the underlying emitter array and the overlying detector array can be adjusted and used to define a channel. The height of this channel can further be adjusted to provide a degree of filtering of a specimen, allowing only objects with a size smaller than the channel height to enter the viewing area. The resolution of this arrayed emitter plus arrayed detector arrangement can be superior to that of the two previous single emitter array embodiments described above and can be used, for example, to create pseudo-3D microscope images.

Figure 1B:
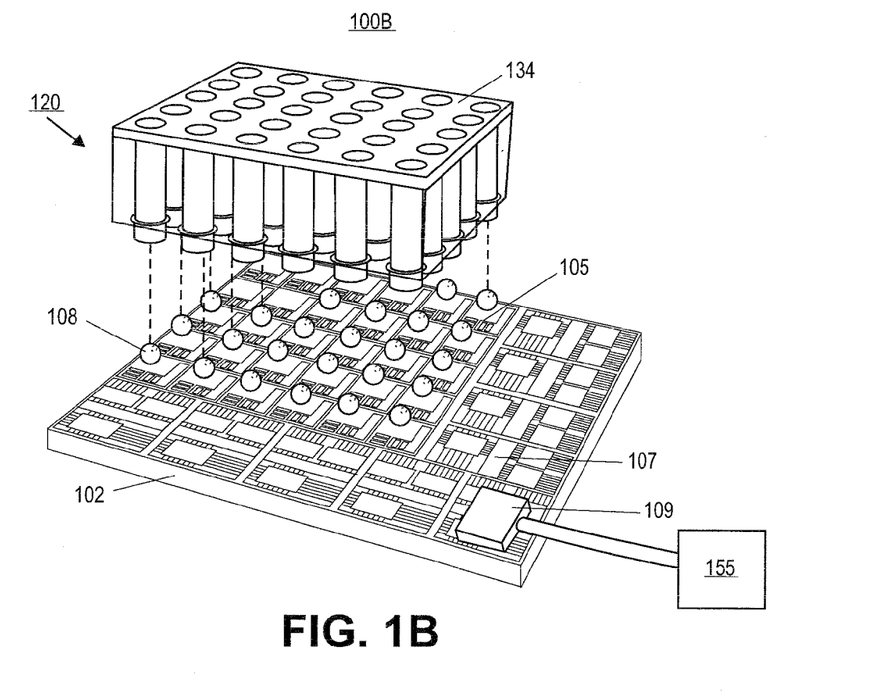
FIG. 1B depicts an exemplary microscope device in accordance with various embodiments of the present teachings.

FIG. 1B is a schematic for an exemplary microscope device 100B in accordance with the present teachings. It should be readily apparent to one of ordinary skill in the art that the device 100B depicted in FIG. 1B represents a generalized schematic illustration and that other layers/light emitters/circuit cells can be added or existing layers/light emitters/circuit cells can be removed or modified.

As shown, the device 100B can include the microscope light emitter array 120 connected with a CMOS integrated circuit 102 through a plurality of bump bonds 108. The CMOS integrated circuit 102 can be a read out integrated circuit (ROIC) including a plurality of ROIC cells 105 and peripheral circuits 107. The light emitter array 120 can further include a plurality of electrical contacts 132 and 134 used as p-side electrodes and n-side electrodes for the light emitters in the array 120. For example, each light emitter in the array 120 can be connected to a corresponding ROIC cell 105 through one bump bond 108. The plurality of ROIC cells 105 can thus be configured having the same pitch p as that for the light emitter array 120 in FIG. 1A.

In various embodiments, the disclosed microscope configuration can build a magnified pixel-by-pixel digital image of the sample object. Specifically, the action of switching on one (or more) light emitter (e.g., the light emitter 122) in the plurality of light emitters, and detecting and storing the intensity of the reflected or transmitted light from the sample object, can create one pixel in the digital image. For example, the photocurrent of the light detectors (e.g., the light emitters 124 in FIG. 1A) in the light emitter array 120 can be summed by, for example, related ROIC cells 105 and transferred at 109 to a control computer 155 to fix the intensity of the first pixel. In one embodiment, the control computer 155 can receive image data via a hi-speed connection and the image can be reconstructed and displayed on the control computer.

Following the creation of the first pixel in the digital image, the light emitter 122 can then be switched off, one of its neighboring light emitters can be switched on, and the operation procedure can be repeated to build up a second pixel in the digital image. This process can be repeated across the area of light emitter array 120 to build the full digital image of the sample object 130. In various embodiments, for objects close to the array surface, the image resolution can be similar to the pitch p between adjacent light emitters.

The peripheral circuits 107 can be used for multiplexing and transferring data from the ROIC cells 105 to the control computer 155. For example, after the image has been collected by some of the light emitters (e.g., 124) in the array 120, various image data manipulation algorithms can be applied to the resulting digital images. Patterns within the image, the image contrast or other image parameters, can be recognized and/or controlled. Unlike conventional optical microscope, the disclosed microscope algorithms can further process the image data in a real-time feedback loop, which can manipulate the switching sequence or switching speed of the individual light emitter to optimize image resolution, enhance specific regions of the image, etc. Due to the sequential switching of light emitters, the microscope devices can provide an average illumination power onto the sample object, which is particularly advantageous for examining biological samples (e.g., living cells) that may be irreversibly degraded by over-illumination. The image resolution can also be improved through advanced digital-imaging processes, some of which are known to one skilled in the art, and additional imaging processes that form the basis of claims discussed below.

Further, the light emitters, such as the LEDs, can be constructed to emit light with a specific wavelength, e.g., chosen to excite a specific mechanism or process in the sample object. For example, various fluorescent dyes or other fluorophores can be used to "stain" specific parts of living cells. The disclosed microscope system 100A can emit a specific wavelength to excite a specific fluorescence in these certain fluorophores. In various embodiments, each light emitter used in the microscope system can be an individually addressable light emitter to provide a specific emission wavelength. With the use of advanced fluorophores, such as NQDs (nanoscale quantum dots) that can be excited by a wide range of wavelengths yet emit only over a narrow wavelength band, various different fluorescences in one sample object can be examined by a single microscope device.

Figure 2:
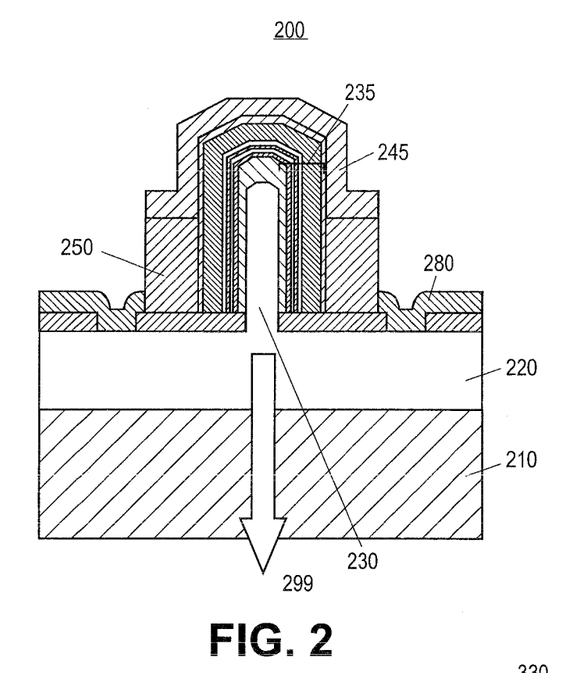
FIG. 2 depicts an exemplary nanowire-based LED structure in accordance with various embodiments of the present teachings.

FIG. 2 depicts an exemplary light emitter 200 that includes a nanowire core-shell structure in accordance with the present teachings. In various embodiments, the exemplary light emitter 200 can be the nanowire devices as described in the related U.S. patent application Ser. No. 11/684,264, entitled "Pulsed Growth of Catalyst-Free Growth of GaN Nanowires and Application in Group III Nitride Semiconductor Bulk Material," which is hereby incorporated by reference in its entirety.

For example, the device 200 can include a layered shell 235 having a MQW "shell" structure formed on the sidewalls of a nanowire core 230. The MQW core-shell structure can be formed over a doped buffer layer 220 over a substrate 210. It should be readily apparent to one of ordinary skill in the art that the device 200 depicted in FIG. 2 represents a generalized schematic illustration and that other nanowires/layers/shells can be added or existing nanowires/layers/shells can be removed or modified.

As shown, the substrate 210 can be a substrate including, but not limited to, sapphire, silicon carbide, silicon and 111-V substrates such as GaAs, or GaN. The doped buffer layer 220 can be formed over the substrate 210. The doped buffer layer 220 can be formed of, for example, GaN, AlN, InN, AlGaN, InGaN or AlInGaN, by various crystal growth methods. In various embodiments, the doped buffer layer 220 can be doped with a conductivity type similar to the doped nanowire core 230.

The nanowire 230 can have an elongated conductive or semiconductive material that includes at least one minor dimension, for example, one of the cross-sectional dimensions such as width or diameter, of less than or equal to about 1000 nm. The nanowires can have an aspect ratio (e.g., length:width and/or major dimension:minor dimension) of about 1 or greater. The nanowires can have various cross-sectional shapes, such as, for example, a rectangular, polygonal, square, oval, or circular shape. The doped nanowire 230 can be formed of, for example, GaN, AlN, InN, AlGaN, InGaN or AlInGaN, which can be made an n-type by doping with various impurities such as silicon, germanium, selenium, sulfur and tellurium or a p-type by introducing beryllium, strontium, barium, zinc, or magnesium.

It is also intended that the term "nanowires" encompasses other elongated structures of like dimensions including, but not limited to, nanoshafts, nanopillars, nanoneedles, nanorods, and nanotubes (e.g., single wall nanotubes, or multiwall nanotubes), and their various functionalized and derivatized fibril forms, such as nanofibers in the form of thread, yarn, fabrics, etc.

In various embodiments, a p-side electrode 245 can be formed on dielectric materials 250 to envelop a portion of the shelled layer 235 such that the p-side electrode 245 can be electrically isolated from adjacent n-side electrodes 280 by the dielectric materials 250, when a number of core-shell structures are included in a large area such as a wafer. The dielectric materials 250 can be formed over the doped buffer layer 220 and on a portion of the sidewalls of the layered shell 235. In addition, n-side electrodes 280 can be formed to assure the conduction between the n-side contact (e.g., the doped buffer layer 220) and the central conductive region including the nanowire core 230.

At 299 in FIG. 2, the emitted light of the nanowire-based LED 200 in FIG. 2 can be extracted through the substrate 220, which can be transparent at the emitted light wavelengths. Alternatively, light output can occur on the top side of the device 200 (not shown). Since the nanowire-based LED device 200 has a small diameter that is comparable or even less than the wavelength of emitted light, a diffracted, diffuse light output can be expected. While this diffuse light output can be advantageous in solid-state lighting applications, a more collimated light beam can be obtained by a thicker metal electrode (not shown) that would form a collimation tube.

Although a single nanowire is depicted in FIG. 2 for the purpose of description, one of ordinary skill in the art will understand that a number of nanowires can be formed simultaneously with a high density in a large area (e.g., a whole wafer).

Figure 3:
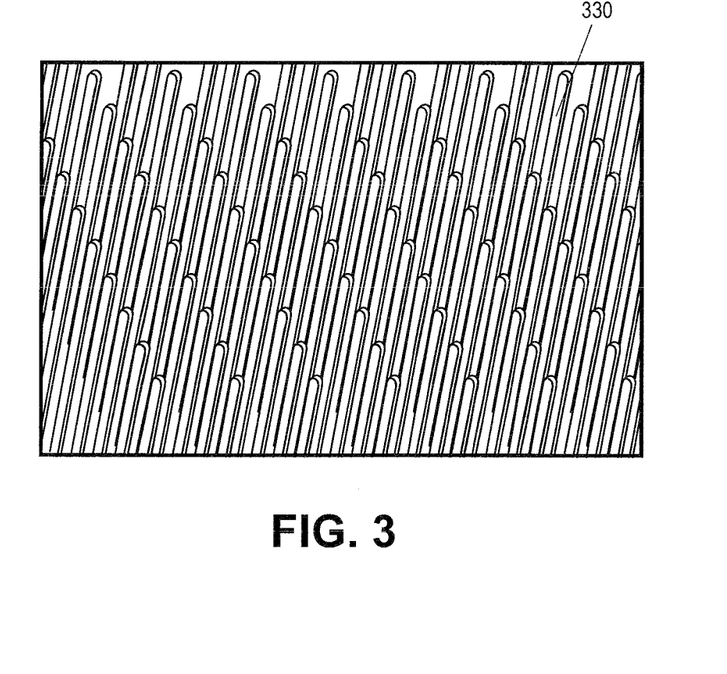
FIG. 3 depicts an exemplary III-N nanowire array in accordance with various embodiments of the present teachings.

FIG. 3 is a schematic for an exemplary III-N nanowire array in accordance with the present teachings. The exemplary GaN nanowire 330 can have high quality (e.g., essentially free of threading defects) and large scale uniformity of position, crystallographic orientation, length, cross-sectional features (e.g., the dimensions and/or shapes). For example, the GaN nanowire 330 can have single crystal GaN with a diameter ranging from about 200 nm to about 300 nm. In addition, the nanowire sidewall facets can be of the non-polar family, which creates an opportunity for eliminating the quantum confined Stark effect (QCSE) from LEDs by using a radial, core-shell LED geometry.

Figure 4:
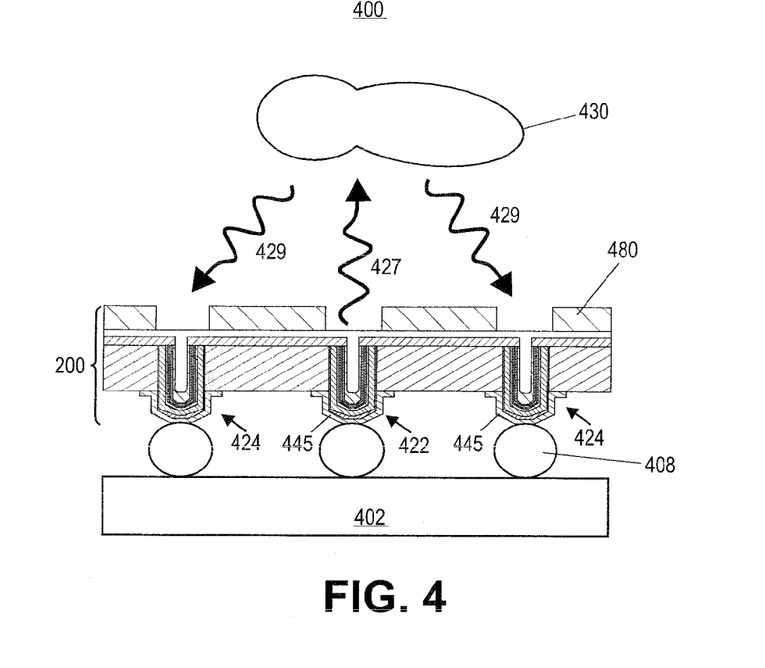
FIG. 4 depicts an exemplary microscope imaging system in accordance with various embodiments of the present teachings.

FIG. 4 depicts an imaging system 400 of an exemplary microscope device having the nanowire LED structure of FIG. 2 in accordance with various embodiments of the present teachings. It should be readily apparent to one of ordinary skill in the art that the system 400 depicted in FIG. 4 represents a generalized schematic illustration and that other nanowires/LEDs can be added or existing nanowires/LEDs can be removed or modified.

As shown in FIG. 4, the microscope system 400 can include, for example, an LED array having a plurality of nanowire LEDs 200 as described in FIG. 2. The plurality of nanowire LEDs 200 can include an exemplary "on" light emitter 422 and two LED light detectors 424 as examples. Each nanowire LED can include a p-side electrode 445 and an n-side electrode 480. An ROIC 402 can be connected to the plurality of nanowire LEDs 200 through, for example, a plurality of conductive structures 408.

During the exemplary reflection type operation, the LED 422 can be an "on" emitter to illuminate a small area of the sample object 430. The emitted light 427 from the "on" light emitters 422 can then be reflected, scattered and/or diffracted from the sample object 430 and the returned light or reflected light 429 can be collected immediately by the surrounding LED light detectors 424 as illustrated.

The photocurrent from the light detectors 424 can be summed by the ROIC 402 and transferred to a control computer (not shown) fixing the intensity of an image pixel. By repeating such process, a pixel-to-pixel magnified image of the sample object 430 can then be built. In various embodiments, the device configuration, the ROIC circuit board, the operation process, along with the data process shown in FIG. 4 can be similar to that described in FIGS. 1A-1B.

In various embodiments, the microscope light emitter array in FIGS. 1A-1B and FIG. 4 can include a planar LED in accordance with the present teachings. The planar LED light emitter array can be fabricated using a "top-down" fabrication process as illustrated in FIGS. 5A-5D in accordance with the present teachings. Specifically, FIGS. 5A-5D depict another exemplary light emitter array 500 at various stages of fabrication in accordance with the present teachings. The planar LED array can include any III-V based LEDs such as GaN-based LEDs.

While the disclosed exemplary fabrication process is illustrated and described below as a series of acts or events, it will be appreciated that the present invention may not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

Figure 5A:
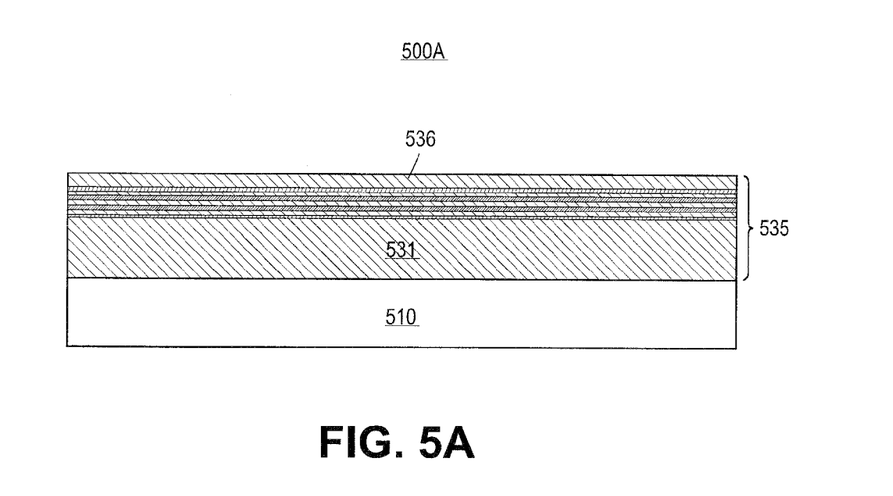
FIGS. 5A-5D depict an exemplary planar LED structure having an LED array at various stages of fabrication in accordance with various embodiments of the present teachings.

In FIG. 5A, an exemplary MQW epitaxial layered LED structure 500A can be formed using methods known to one of ordinary skill in the art. For example, the MQW LED structure 500A can include a substrate 510 and a layered MQW structure 535. In various embodiments, the dopants and the materials used for each layer of the LED structure 500A can be similar as those described above for FIG. 2 and FIG. 4. In an exemplary embodiment, the layered MQW structure 535 can include an InGaN based MQW active region disposed between an n-doped GaN layer 531 and a p-doped AlGaN layer. P-doped GaN layer 536 can be formed over the p-doped AlGaN layer over the InGaN based MQW active region. The n-doped GaN layer 531 can be formed on the substrate 510.

Figure 5B:
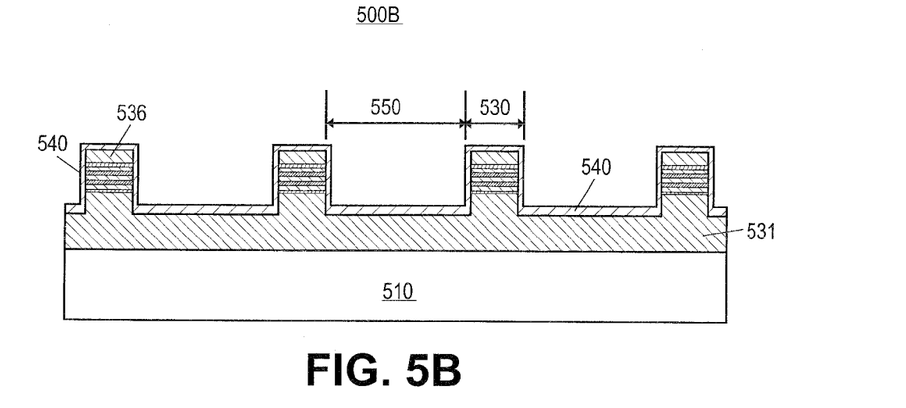

In FIG. 5B, a plurality of LED mesas 530 can then be defined by etching the structure 500A to the n-doped GaN layer 531 and having recessed spaces 550 between any two adjacent LED mesas. In various embodiments, during this etching, the etching damage can be minimized and thereby providing a small diameter, for example, about 5 microns or less, of each LED and rendering the proximity of the LED active region an etched-mesa sidewall-surface. Several suitable strategies can be used for minimizing such damage. For example, an RIE (reactive ion etch) etching process can be first conducted and followed by a passivation process to the RIE damage. This is because the RIE process can damage the surface and subsurface of the mesa sidewalls, although the RIE process can provide a shape control to the LED mesas. The passivation process can then be performed by either a wet-etch treatment, a surface passivation layer 540, or by both of these. The surface passivation layer 540, for example, a dielectric layer including such as silicon nitride, can be formed on the entire surface of the etched structure 500A including the LED mesas and the recessed spaces between the LED mesas. In various embodiments, the etching process can include, for example, standard ICP (i.e., inductively coupled plasma) mesa etch techniques known to one of ordinary skill in the art.

In various embodiments, the dimensions of the LED mesas 530 and the recessed spaces 550 can determine the pitch p of the microscope array (e.g., configured similarly as in FIGS. 1A-1B and FIG. 4) and thus determine the resulting image resolution. For example, if an LED array is designed to have a pitch p of about 20 microns, the LED mesa diameter/width can be etched to be about 5 microns leaving a recessed space 550 of about 15 microns wide between adjacent mesas 530. In various embodiments, the recessed space can provide a sufficient space to subsequently run, e.g., the n-side contact metal contacts out to the edges of the microscope device/chip.

Figure 5C:
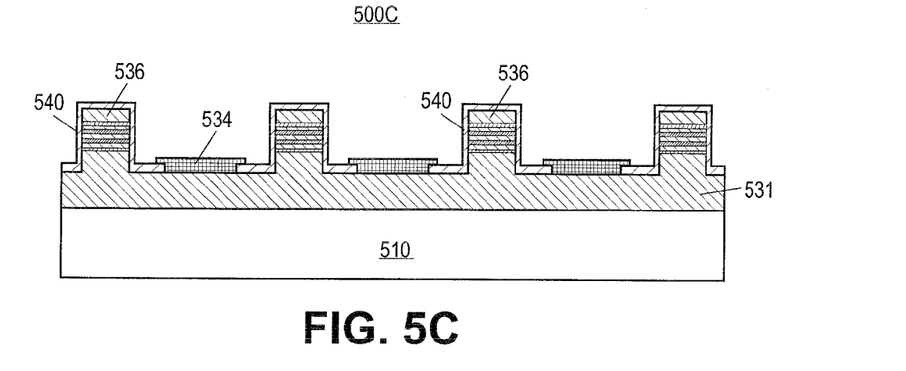

In FIG. 5C, the passivation layer 540 within the recessed spaces 550 can then be patterned by photolithography and etched to allow deposition and definition of a plurality of n-side metal contacts 534. These lower n-side contacts 534 can thus be connected to a first doped layer 531, e.g., an n$^+$ GaN layer, of the layered MQW structure 535 and can run as stripes that are perpendicular to the plane of the FIG. 5C page.

Figure 5D:
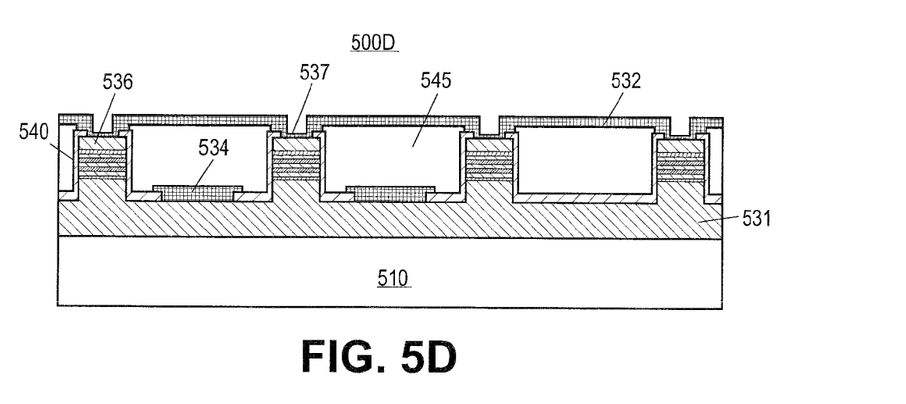

In FIG. 5D, the n-contacts 534 can be buried, for example, under a spin-on, curable and etchable dielectric material 545 that completely fills the recessed space 550 between the mesas 530 (also see FIG. 5B-5C). The passivation layer 540 and spin-on-dielectric 545 can then be patterned by photolithography and etched to allow deposition and definition of the p-side metal contact stripes 532. The lithographically defined p-side electrode recess 537 in the p-side metal 532 can keep the metal transparent over the central part of each LED mesa to allow light emission. The p-side metal contact 532 can be in the form of stripes and can run in a direction parallel to the plane of the figure page, e.g., in a direction of left-to-right. This can create an X-Y contact array where each stripe can be accessible at the edge of the microscope "chip" and all LEDs in the array can be individually addressable.

FIGS. 6A-6G depict another exemplary microscope device at various stages of fabrication in accordance with various embodiments of the present teachings.

Figure 6A:
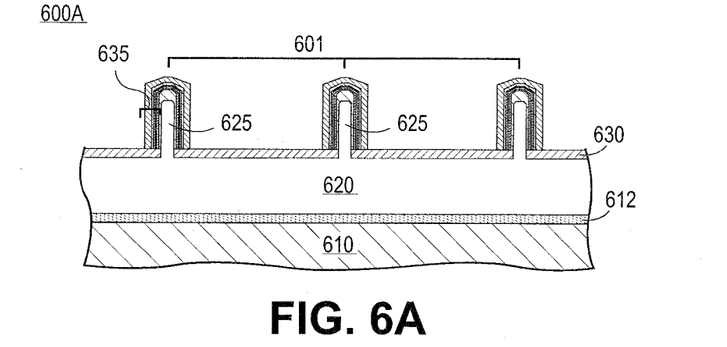
FIGS. 6A-6F depict another exemplary microscope device at various stages of fabrication in accordance with various embodiments of the present teachings.

In FIG. 6A, the device 600A can include an exemplary array 601 of core-shell structures with each core-shell structure having a layered shell 635 formed on the sidewalls of each nanowire 625 to envelop the nanowire. The nanowire 625 can be doped and can be used as a core structure configured coaxially with the layered shell 635.

The device 600A can also include a growth mask dielectric 630 formed on a doped buffer layer 620. The doped buffer layer 620 can be formed over a substrate 610. Each nanowire 625 of the array 601 can be formed on the doped buffer layer 620 through the growth mask dielectric 630. The growth mask dielectric 630 can be made of dielectric materials as disclosed herein during the formation of the plurality of nanowires and/or nanowire arrays. According to various other embodiments, a conducting metal growth mask, such as, for example, tungsten, can also be used for selectively growing the nanowire array. In embodiments, a second buffer layer 612, doped or undoped, can be optionally formed between the doped buffer layer 620 and the substrate 610.

In embodiments, the core-shell structure of the array 601 can be the same as the nanowire-based core-shell structure of the light emitter 200 depicted in FIG. 2, although in embodiments the materials and the conductivities used for each layer of FIGS. 2 and 6A can be different. In embodiments, the core-shell structure array 601 can include the nanowire-based core-shell structures as described in the related U.S. patent application Ser. No. 11/684,264, entitled "Pulsed Growth of Catalyst-Free Growth of GaN Nanowires and Application in Group III Nitride Semiconductor Bulk Material," which is hereby incorporated by reference in its entirety.

Figure 6B:
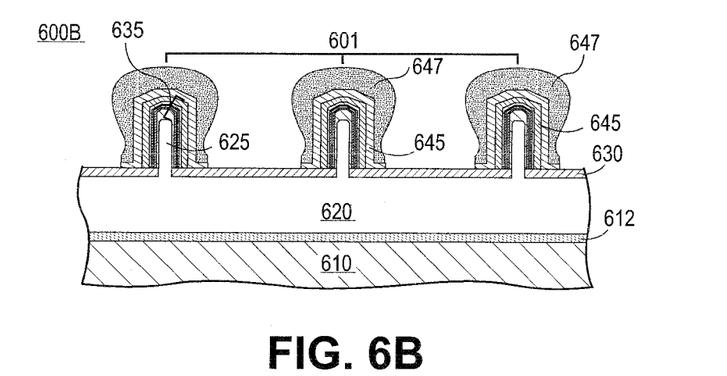

In FIG. 6B, a p-side semiconductor 645 can be formed on the shell surface of each core-shell structure of the array 601 in FIG. 6A. For example, the p-side semiconductor 645 can be formed by depositing a semiconductor layer (not shown) on the entire surface of the device 600A of FIG. 6A and then patterning the semiconductor layer to form the plurality of p-side semiconductors 645 each enveloping the layered shell 635. The p-side semiconductor 645 can also cover surface portions of the selective growth mask 630 that are adjacent to the shell structure 635. In embodiments, a second p-side electrode 647 can be formed on the p-side semiconductor 645, e.g., by depositing one or more metals or by continuously growing the p-side semiconductor 645. The p-side electrode 647 can be geometrically isolated from adjacent p-side electrodes 647.

Figure 6C:
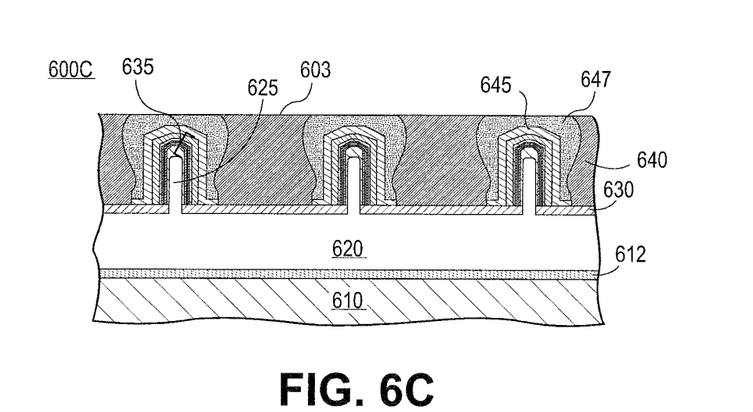

In FIG. 6C, dielectric material 640 can be deposited to fill the gap between the second p-side electrodes 647 disposed on core-shell structures of the array 601 for an electrical isolation. In embodiments, the device 600C can also include a planarized surface 603 formed of the electrodes 647 and the dielectric material 640 and processed by, e.g., chemical mechanical planarization (CMP) or other suitable planarization methods.

Figure 6D:
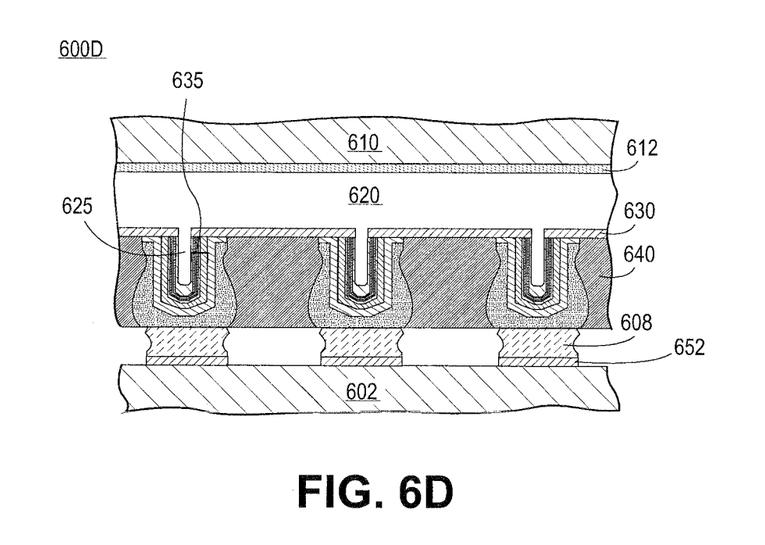

In FIG. 6D, the device 600C of FIG. 6C can be inverted to attach its planarized surface 603 to a read out integrated circuit (ROIC) 602 (also see 102 of FIG. 1B and/or 402 of FIG. 4), such as a printed circuit board (PCB). For example, each p-side electrode 647 can be electrically connected to a corresponding bond pad 652 on the ROIC 602 through conductive structures 608. The conductive structures 608 can be formed by, such as, for example, solder balls, indium bump-bonds, metals, or other conductive structures as known in the art.

In embodiments, by controlling the bonding methods, composition, and/or annealing process of the conductive structures 608, a stress free or strain free bonding between each p-side electrode 647 and the ROIC 602 can be obtained. The stress/strain free bonding is important because residual stress/strain generated in the conductive structures or bump bonds may crack and therefore damage the final LED structure.

Figure 6E:
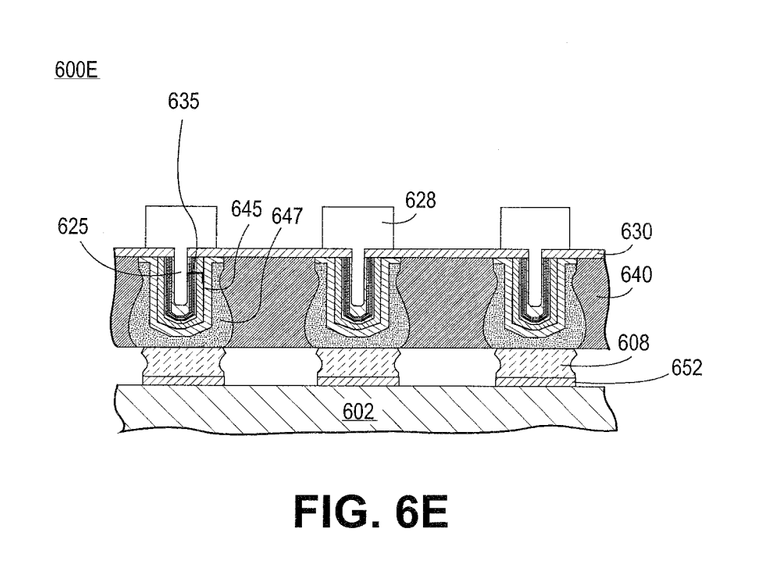

The substrate 610, for example, a sapphire substrate, can then be removed from the device 600D by techniques known to one skilled in the art, to expose the doped buffer layer 620. The exposed doped buffer layer 620 can then be patterned to form a plurality of n-side semiconductors 628 as shown in FIG. 6E. The n-side semiconductors 628 can remain connected with the nanowire core 625 and situating on surface portions of the growth mask dielectric 630. The n-side semiconductors 628 can be geometrically isolated with each other at this stage.

Figure 6F:
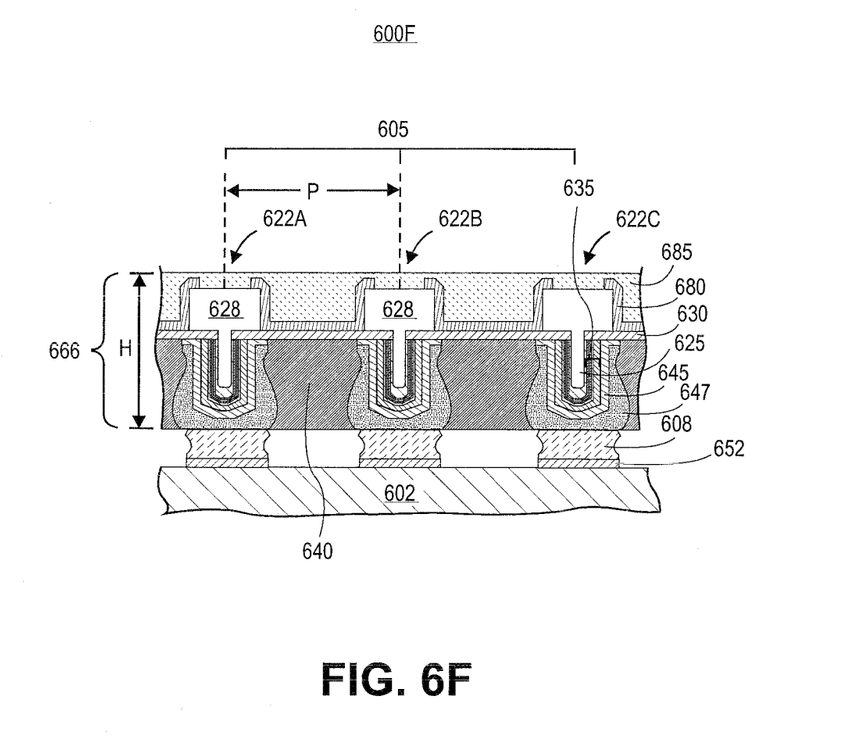

In FIG. 6F, n-side electrodes 680 can be formed by depositing an electrode material such as metal(s) on the entire surface of the device 600E in FIG. 6E, followed by a patterning process to expose a portion of each n-side semiconductors 628. The device 600F can also include a second dielectric layer 685 deposited to cover the entire surface of the device, e.g., to cover the n-side electrodes 680 and the exposed n-side semiconductors 628. The n-side electrodes 680 can be formed to assure the conduction between the n-side semiconductor 628 and the central conductive region including the nanowire core 625.

In this manner, an array of LED structures 666 can be formed over the ROIC 602 as shown in FIG. 6F. The LED structure 666 can include an LED array and can be sufficiently thin such that the microscope device 600F can be placed close enough to sample objects for a magnified observation. For example, the LED structure 666 can have a height H ranging from about 2 μm to about 20 μm, e.g., about 6 μm.

The LED structure 666 can include an LED array having a plurality of LEDs 622a-c as shown in FIG. 6F. In embodiments, a pitch p between adjacent LEDs 622a-c can, e.g., range from about 1 μm to about 100 μm, to provide desired optical resolution. In embodiments, the pitch p can be determined by dimensions of the LEDs 622a-c, e.g., the sidewall electrode thickness, and/or by dimensions of interconnect width between adjacent conductive bond pads 652 on the ROIC 602, which can in turn be defined by the LED current that is required.

Each LED 622a-c can be electrically connected to the ROIC 602 and can include the core-shell structure 635, the n-side semiconductor 628, the n-side electrode 680, the p-side semiconductors and electrodes 645-647, as shown in FIG. 6F. In embodiments, the n-side electrodes 680 and the p-side electrodes 647 can use an absorbing metal that is thick enough to reduce or avoid light leakage between adjacent LEDs. The absorbing metal can include, for example, gold, or alloys of gold, or other metals known by one of ordinary skill in the art to form ohmic contacts to the semiconductor material that they are contacting. Eliminating the light leakage in this way can increase the signal-to-noise ratio (S/N ratio) of the LED detectors. For example, an absorbing metal gold can have an index at blue ($\lambda$=450 nm) of about 1.4 to about 1.88 and can have an absorption coefficient of about 0.0525 nm$^{-1}$ ($4\pi k/\lambda$). A gold film will have a transparency ($I/I_0$) of $I/I_0$=10$^{-0.0525t}$, where t is film thickness in nanometer. So, for a 100 nm thick gold film the transparency can be about $5.6 \times 10^{-6}$.

In embodiments, each of the p-side electrode 647 and the n-side electrode 680 can have an average thickness ranging from about 100 nm to about 500 nm, although the thickness of the p-side electrode 647 or the n-side electrode 680 is not limited.

In embodiments, the growth mask dielectric 630 (see FIGS. 6A-6F) can have a thickness sufficient to provide isolation between LEDs 622a-c and to avoid electrical leakage across the selective growth dielectric 630. For example, breakdown field for exemplary SiNx thin films is about 3 MV/cm. A 30 nm SiNx will then breakdown at 9V. Breakdown field for SiNx thin films having a thickness of about 100 nm can be about 30V. In embodiments, the growth mask dielectric 630 can have a thickness of about 30 nm or greater, e.g., about 100 nm or greater. In embodiments, the integrity of this dielectric layer can be independently checked by, e.g., a test structure on the mask-set that is processed during fabrication of the LED.

Figure 7:
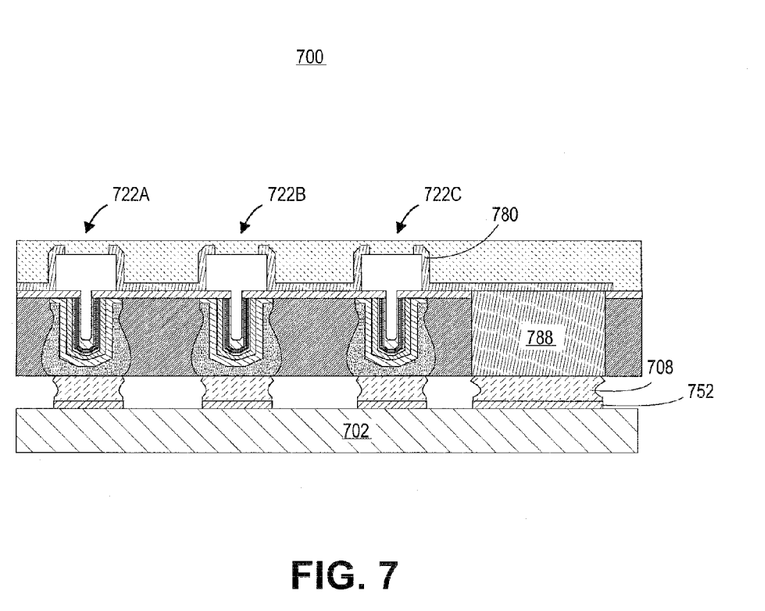
FIG. 7 depicts a portion of an exemplary microscope device in accordance with various embodiments of the present teachings.

In embodiments, a common contact can be used for the n-side electrodes 680 or the p-side electrodes 647 of the LED array 605, for example, as shown in FIG. 7. FIG. 7 depicts an exemplary microscope device 700 formed according to FIGS. 6A-6F in accordance with various embodiments of the present teachings.

As shown, the n-side electrode contacts 780 of the plurality of LEDs 722 a-c can be connected with each other through a large VIA contact 788. The large contact 788 can allow ROIC 702 to connect to the common LED n-side electrodes through a conductive structure 708 and a bond pad 752 as shown.

FIGS. 8A-8B depict exemplary microscope imaging systems in accordance with various embodiments of the present teachings.

As shown in FIG. 8A, the imaging system 800A can include an LED array 805 having LEDs 822*a-f*, for example. The imaging system 800A can be used to observe and image a sample object 830. In an exemplary embodiment for producing a magnified image (also see FIG. 4), a first image pixel can be formed by switching on a first exemplary LED 822*c* of the LED array 805 to illuminate a first portion of a sample object 830 through an emitted light 827 from the LED 822*c*. The emitted light 827 from the "on" light emitter 822*c* can then be reflected, scattered and/or diffracted from the sample object 830 and the returned light or reflected light 829 can be detected and collected immediately by a first plurality of LEDs 822*b* and 822*d* surrounding the first LED 822*c*.

Likewise, a second image pixel can be formed by switching off the first LED 822*c* and switching on, for example, a second LED 822*b* to illuminate a second portion of the sample object 830 and using a second plurality of LEDs 822*a* and 822*c* that surrounds the second LED 822*b* to collect a reflected light from the illuminated second portion of the sample object 830.

The photocurrent detected by the LED light detectors can be summed by the ROIC 802 and transferred to a control computer 855 to fix the intensity of each image pixel. By repeating such process, a pixel-to-pixel magnified image of the sample object 830 can be built. The control computer 855 can, for example, receive image data and can include data handling algorithms.

FIG. 8B depicts another exemplary imaging system in accordance with various embodiments of the present teachings. In this example, double-sided imaging can be performed by using two microscope devices to illuminate and detect one sample object 830. For example, a second microscope device 800B including an LED array 805B can be placed above the first device 800A having an LED array 805A. The LED array 805B can include a plurality of LEDs 822*m*-822*r*. The LED array 805B can be a detector array having a detector pitch p that is identical to the pitch p of the LED array 805A.

The two microscope devices having LED arrays 805A-B can be configured in parallel or forming an angle such that both of them can be exposed to the sample object 830. In an exemplary embodiment for a parallel configuration, the spacing between the underlying LED array 805A and the overlying detector array 805B can be adjusted to define a sample channel. In embodiments, the height of this channel can further be adjusted to provide a degree of filtering of a specimen, allowing only objects with a size smaller than the channel height to enter the viewing area. For example, the channel can have a height ranging from about 10 µm to about 100 µm, although other height ranges can be included. Such configuration shown in FIG. 8B can provide high image resolution e.g., ranging from about 1 µm to about 100 µm; and can be used, for example, to create pseudo-3D microscope images.

During an imaging operation, exemplary LED 822*c* can be turned "on" to illuminate a portion of the sample object 830 providing reflected light 829 and transmitted light 823. The reflected light 829 from the illuminated portion of the sample object 830 can be collected by LEDs 822*b* and 822*d* surrounding the LED 822*c*. The transmitted light 823 through the illuminated portion of the sample object 830 can be detected and collected by corresponding LEDs 822*n*, 822*o*, and 822*p* of the second LED array 805B to form a first image pixel. As similarly described in FIG. 8A, another image pixel can be formed by switching off the LED 822C but switching on other LEDs and using surrounding LEDs of the first LED array 805A to collect the reflected light from the illuminated sample object and using corresponding LEDs of the second LED array 805B to collect transmitted image information from the sample object.

Likewise, the photocurrent detected each time by switching on different LEDs can be summed by the ROIC 802A and 802B, and both transferred to a control computer 855 to fix the intensity of each image pixel. By repeating such process, a pixel-to-pixel magnified image of the sample object 830 can be built and/or displayed on the control computer 855. In embodiments, the double-sided imaging configuration can create a channel for liquid samples (e.g., biological cells suspended in an aqueous solution) by adjusting the spacing between the two microscope devices. In various embodiments, the device configuration, the ROIC circuit board, the operation process, along with the data process shown in FIGS. 8A-8B can be similar to that described in FIGS. 1A-1B and FIG. 4.

In embodiments, when using either the single-sided (FIG. 8A) or double-sided microscope (FIG. 8B) the ability to control in real time, which pixels are active, allows the disclosed microscope to replicate the "fovea" function that is a key feature of human vision. At the control computer, the user can select which part, or parts, of the full image field are of interest. The microscope can then activate only those pixels (LEDs) required to view that part(s) of the image field. This imaging strategy can avoid collecting redundant data, which helps to reduce the data rate flowing from the microscope to the control computer thereby keeping the data rate more manageable. In this manner, the real-time selection and focusing of only a portion of the full image field can replicate the action of the fovea in human vision.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a microscope device comprising:
    forming a light emitting diode (LED) array comprising a plurality of LED core-shell structures with each LED core-shell structure comprising:
        a doped buffer layer disposed on a substrate,
        a growth mask dielectric disposed on the doped buffer layer,
        a nanowire core formed on the doped buffer layer through the growth mask dielectric, and
        a layered shell formed to envelop the nanowire core, wherein the layered shell comprises a multi-quantum-well (MQW) active region;
    forming a p-side semiconductor to envelop the layered shell of each LED core-shell structure;
    forming a p-side electrode having a thickness ranging from about 100 nm to about 500 nm to envelop the p-side semiconductor;
    filling a dielectric material between adjacent p-side electrodes for an electrical isolation, providing a surface comprising both the p-side electrodes and the dielectric material;
    inverting the LED array to attach the surface comprising both the p-side electrodes and the dielectric material to a readout integrated circuit (ROIC);
    removing the substrate of the LED array to expose the doped buffer layer; and
    patterning the doped buffer layer to form a plurality of n-side semiconductors on the growth mask dielectric with each n-side semiconductor connecting with the nanowire core of a corresponding LED core-shell structure.

2. The method of claim 1, further comprising
    forming an n-side electrode on each n-side semiconductor of the plurality of n-side semiconductors,
    forming a VIA contact connecting the plurality of the n-side electrodes, and
    electrically connecting the VIA contact to the ROIC.

3. The method of claim 1, further comprising controlling a pitch p between adjacent LED core-shell structures by reducing dimensions of each LED core-shell structure.

4. The method of claim 1, further comprising planarizing the surface comprising both the p-side electrodes and the dielectric material prior to inverting the LED array.

5. The method of claim 1, further comprising using an absorbing metal for the p-side electrode to reduce light leakage between adjacent LED core-shell structures of the LED array.

6. The method of claim 1, further comprising adjusting a bonding method, a bonding composition, and an anneal process for a stress free attachment of the LED array to the ROIC, prior to removing the substrate.

* * * * *